(12) United States Patent
Li et al.

(10) Patent No.: US 11,670,641 B2
(45) Date of Patent: Jun. 6, 2023

(54) TRANSPARENT DISPLAY AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventors: Zhuhui Li, Shenzhen (CN); Yong Fan, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 302 days.

(21) Appl. No.: 16/626,349

(22) PCT Filed: Dec. 4, 2019

(86) PCT No.: PCT/CN2019/123067
§ 371 (c)(1),
(2) Date: Dec. 24, 2019

(87) PCT Pub. No.: WO2021/103076
PCT Pub. Date: Jun. 3, 2021

(65) Prior Publication Data
US 2021/0366935 A1   Nov. 25, 2021

(30) Foreign Application Priority Data
Nov. 25, 2019 (CN) .......................... 201911167388.3

(51) Int. Cl.
*H01L 27/12* (2006.01)
*B60K 35/00* (2006.01)

(52) U.S. Cl.
CPC ........ *H01L 27/124* (2013.01); *H01L 27/1259* (2013.01); *B60K 35/00* (2013.01); *B60K 2370/785* (2019.05)

(58) Field of Classification Search
CPC .............. H01L 27/124; H01L 27/3276; G02F 1/136286
See application file for complete search history.

(56) References Cited

U.S. PATENT DOCUMENTS

2006/0081850 A1* 4/2006 Lee .................... G02F 1/136286
257/72
2017/0207288 A1* 7/2017 Kang .................... H01L 27/326
(Continued)

FOREIGN PATENT DOCUMENTS

CN    107121860 A  *  9/2017  ....... G02F 1/136286

*Primary Examiner* — Peter M Albrecht
(74) *Attorney, Agent, or Firm* — PV IP PC; Wei Te Chung; Zhigang Ma

(57) ABSTRACT

The transparent display includes a substrate and a plurality of frame traces. The substrate includes a transparent display region and a frame region defined on a left side, a right side, and an upper side of the transparent display region. The plurality of frame traces are disposed in the frame region, and each frame trace includes a hollow portion and a conductive portion surrounding the hollow portion. B disposing the hollow portion in each frame trace to improve a transmittance of each frame trace, thereby improving a transparency of the frame region, reducing a risk of disconnection, and improving a product yield.

7 Claims, 7 Drawing Sheets

(56) References Cited

U.S. PATENT DOCUMENTS

2019/0265478 A1\* 8/2019 Cok ................... G02B 27/0172
2020/0221569 A1\* 7/2020 Shi ........................ H05K 3/303

\* cited by examiner

TRANSPARENT DISPLAY AND MANUFACTURING METHOD THEREOF

FIELD OF INVENTION

The present invention relates to the field of display technologies, and in particular, to a transparent display and a manufacturing method thereof.

BACKGROUND OF INVENTION

Advances in modern technology have greatly changed people's lifestyle. Especially in the Internet era, people's clothing, food, shelter, and transportation have undergone tremendous changes. People can shop, order food, book hotels, book taxis online, etc. These methods rely on advanced display technologies displays are user's interactive interfaces, which can provide users with rich display contents, and the user can also edit contents of the display through input tools.

The Displays are everywhere in our daily lives, with mobile phones being the most typical representative. The Displays have different forms due to different applications. Mobile products usually smaller, thinner, and more diverse. Public display electronics are usually large and heavy. With advancements of technologies and improvements of people's material living standards, people have put forward higher requirements for displays. Special applications require more demanding displays. At present, an overall development trend of displays is thin and light, large size, foldable, anti-drop, high response speed, high display quality, ultra-narrow frame or no frame. Some applications also require transparent displays.

At present, mainstream transparent displays are mainly divided into non-self-emitting transparent displays and self-emitting transparent displays. The non-self-emitting transparent displays usually have a transmittance of less than 20%, and they are transparent only when they are lit, and they display black when they are powered off. The self-emitting transparent displays can be transparent with or without power. However, whether they are non-self-emitting transparent displays or self-emitting transparent displays, their frames are opaque. The opaque frames greatly affect effects of transparent display. In order to solve the above problems, the usual method is to block the frames with lenses or optical films, but a transparency of frame regions cannot be achieved.

In some special scenes, such as transparent displays used in windshields of vehicles, are required that entire displays, including frame regions, must be transparent; otherwise, driver's sights will be seriously affected, driving blind spots will occur, and security risks will occur.

Technical Problem

An objective of the present invention is to provide a transparent display, which can improve a transparency of a frame region, reduce a risk of disconnection, and improve a product yield.

The objective of the present invention is further to provide a manufacturing method of a transparent display, which can improve a transparency of a frame region, reduce a risk of disconnection, and improve a product yield.

In order to achieve the above objective, the present invention provides a transparent display comprising a substrate and a plurality of frame traces;

wherein the substrate comprises a transparent display region and a frame region surrounding the transparent display region; and wherein the plurality of frame traces are disposed in the frame region, and each frame trace comprises a hollow portion and a conductive portion surrounding the hollow portion.

In each frame trace, a ratio of an area of the hollow portion to an area of the conductive portion is greater than 1.5.

The hollow portion comprises a plurality of triangular transparent sub-regions arranged in a mesh shape.

The hollow portion comprises a plurality of diamond-shaped transparent sub-regions arranged in sequence, and two corners of two adjacent diamond-shaped transparent sub-regions are arranged opposite with each other.

The plurality of frame traces comprise a plurality of first frame traces and a plurality of second frame traces;

the plurality of first frame traces are disposed on a first metal layer, the plurality of second frame traces are disposed on a second metal layer, and an insulating layer is provided between the first metal layer and the second metal layer;

the transparent display region is provided with a plurality of data lines arranged in parallel and spaced apart, and a plurality of scan lines arranged in parallel and spaced apart and intersect the plurality of data lines, wherein the plurality of data lines are disposed in the second metal layer, and the plurality of scan lines are disposed in the first metal layer;

each data line is electrically connected to one of the second frame traces; and each scan line is electrically connected to one of the first frame traces.

The present invention further provides a manufacturing method of a transparent display. The method comprises following steps of:

S1: providing a substrate; wherein the substrate comprises a transparent display region and a frame region surrounding the transparent display region; and S2: forming a plurality of frame traces in a frame region; wherein each frame trace comprises a hollow portion and a conductive portion surrounding the hollow portion.

In each frame trace, a ratio of an area of the hollow portion to an area of the conductive portion is greater than 1.5.

The hollow portion comprises a plurality of triangular transparent sub-regions arranged in a mesh shape.

The hollow portion comprises a plurality of diamond-shaped transparent sub-regions arranged in sequence, and two corners of two adjacent diamond-shaped transparent sub-regions are arranged opposite with each other.

The plurality of frame traces comprise a plurality of first frame traces and a plurality of second frame traces; and wherein S2 further comprises the steps of:

S21: forming a first metal thin film on the substrate, and patterning the first metal thin film to obtain a first metal layer; wherein the first metal layer comprises a plurality of scan lines and a plurality of first frame traces arranged in parallel in the transparent display region, and each scan line is electrically connected to one of the first frame traces;

S22: forming an insulating layer on the substrate and the first metal layer; and S23: forming a second metal thin film on the insulating layer, and patterning the second metal thin film to obtain a second metal layer; wherein the second metal layer comprises a plurality of data lines and a plurality of second frame traces, the plurality of data lines are arranged in parallel in the transparent display region and intersected the plurality of scan lines, and each data line is electrically connected to one of the second frame traces.

The beneficial effects of the present invention: The present invention provides a transparent display comprising a substrate and a plurality of frame traces. The substrate comprises a transparent display region and a frame region surrounding the transparent display region. The plurality of frame traces are disposed in the frame region, and each frame trace comprises a hollow portion and a conductive portion surrounding the hollow portion. By disposing the hollow portion in each the frame trace to improve a transmittance of each the frame trace, thereby improving a transparency of the frame region, reducing a risk of disconnection, and improving a product yield. The present invention further provides a manufacturing method of the transparent display, which can improve a transparency of a frame region, reduce a risk of disconnection, and improve a product yield.

DESCRIPTION OF DRAWINGS

In order to further understand the features and technical contents of the present invention, please refer to following detailed description and drawings of the present invention. However, the drawings are provided for reference and explanation only, and are not intended to limit the present invention.

In the drawings.

DETAILED DESCRIPTION OF PREFERRED EMBODIMENTS

Figure 1:
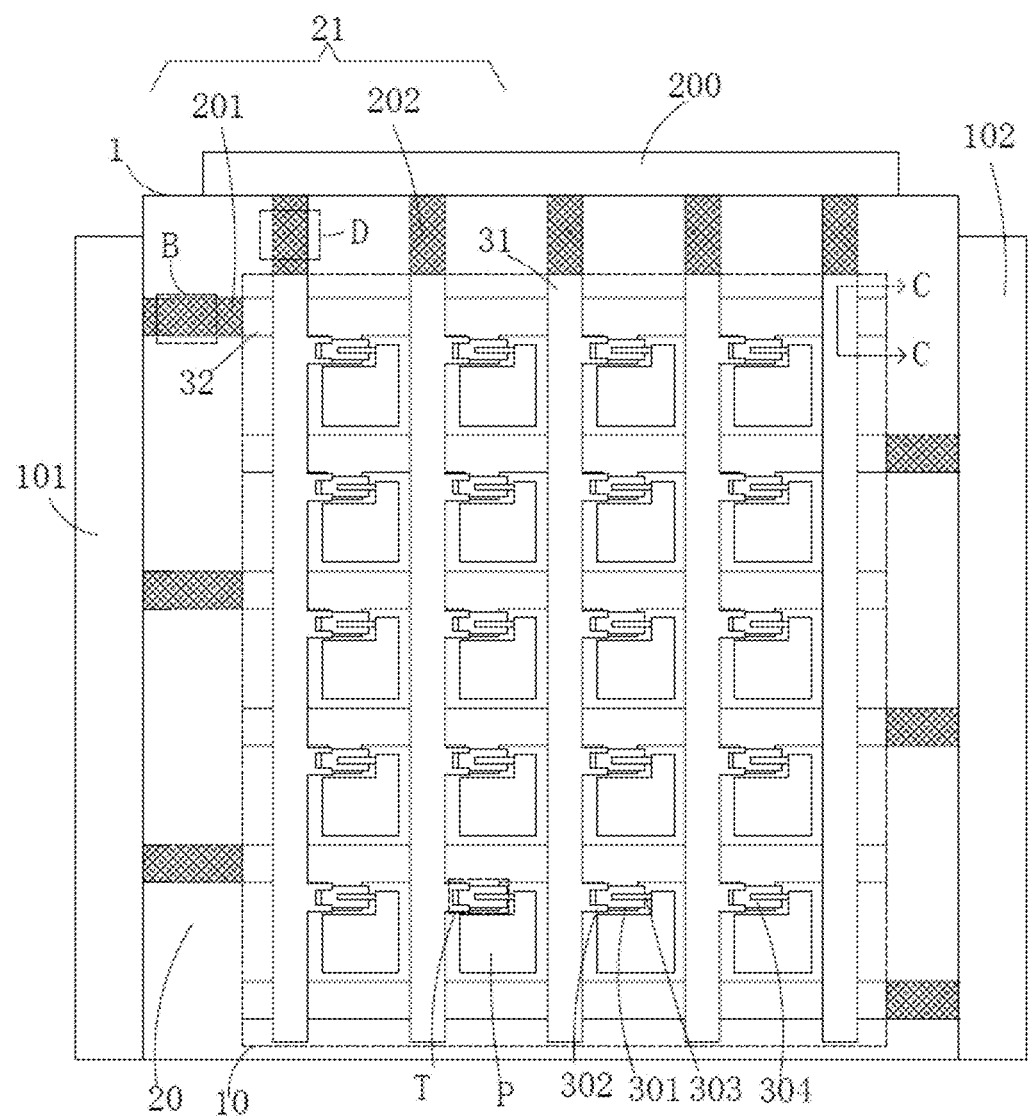
FIG. 1 is a schematic top view of a transparent display of the present invention.

In order to further explain the technical means adopted by the present invention and its effects, the following describes in detail with reference to the preferred embodiments of the present invention and the accompanying drawings.

Please refer to FIG. 1 to FIG. 4, the present invention provides a transparent display comprising a substrate 1 and a plurality of frame traces 21.

The substrate 1 comprises a transparent display region 10 and a frame region 20 surrounding the transparent display region 10.

The plurality of frame traces 21 are disposed in the frame region 20, and each frame trace 21 comprises a hollow portion 211 and a conductive portion 212 surrounding the hollow portion 211.

Specifically, in a preferred embodiment of the present invention, a ratio of an area of the hollow portion 211 to an area of the conductive portion 212 is greater than 1.5. Therefore, a transmittance of each frame trace 21 is greater than 60%, so as to ensure that each frame trace 21 has a high transmittance, so that the overall look and feel of the frame region 20 is transparent and invisible.

Figure 3:
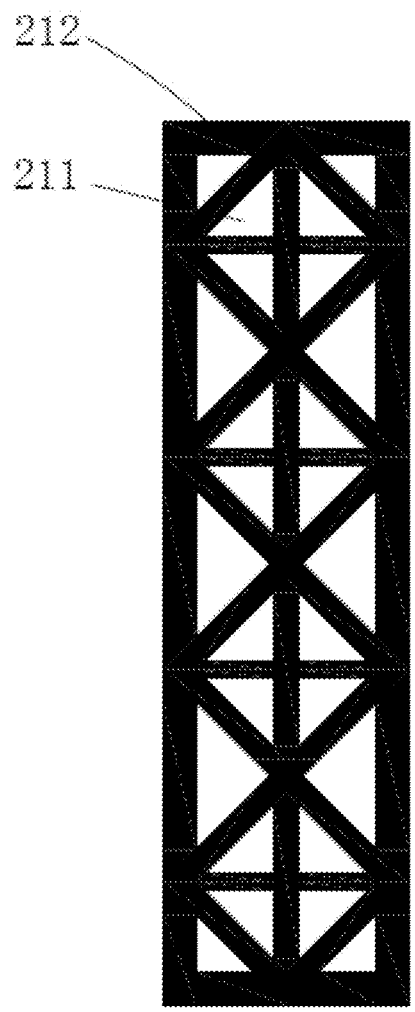
FIG. 3 is a schematic view of a first embodiment of a frame trace in the transparent display of the present invention.

Specifically, a pattern shape of the hollow portion 211 can be disposed correspondingly as required. A typical example is shown in FIG. 3. In a first embodiment of the present invention, the hollow portion 211 comprise a plurality of triangular transparent sub-regions arranged in a mesh shape.

Figure 4:
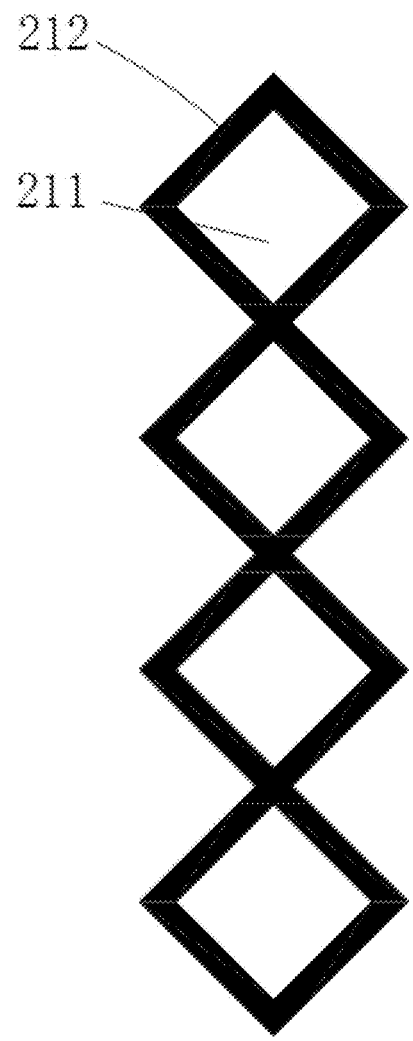
FIG. 4 is a schematic view of a second embodiment of the frame trace in the transparent display of the present invention.

In addition, as shown in FIG. 4, in a second embodiment of the present invention, the hollow portion 211 may further comprises a plurality of diamond-shaped transparent sub-regions arranged in sequence, and two corners of two adjacent diamond-shaped transparent sub-regions are arranged opposite with each other.

Figure 2:
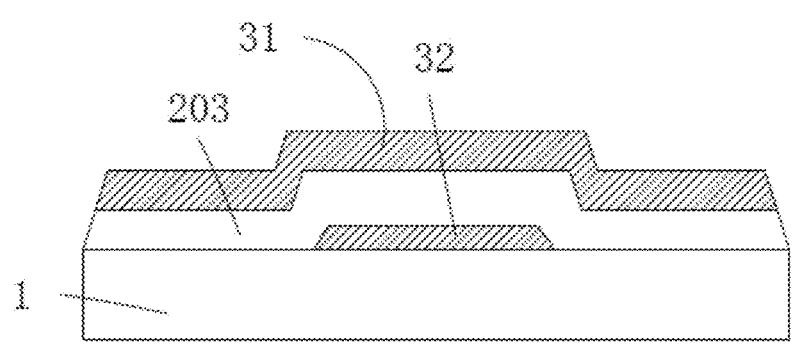
FIG. 2 is a sectional view at C-C in FIG. 1.

Specifically, as shown in FIG. 1 and FIG. 2, the plurality of frame traces 21 in the present invention comprise a plurality of first frame traces 201 and a plurality of second frame traces 202. Wherein, the plurality of first frame traces 201 are disposed on a first metal layer, the plurality of second frame traces 202 are disposed on a second metal layer, and an insulating layer 203 is provided between the first metal layer and the second metal layer.

Correspondingly, in some embodiments of the present invention, both the hollow portions 211 of the first frame traces 201 and the second frame traces 202 have a plurality of triangular transparent sub-regions arranged in a mesh shape. That is, the first frame traces 201 at a B position in FIG. 1 is enlarged to obtain a pattern shown in FIG. 3. Similarly, the second frame trace 202 at a D position in FIG. 1 can be enlarged to obtain a pattern shown in FIG. 3.

Correspondingly, in some embodiments of the present invention, both the hollow portions 211 of the first frame trace 201 and the second frame trace 202 have a plurality of diamond-shaped transparent sub-regions arranged in sequence, and two corners of two adjacent diamond-shaped transparent sub-regions are arranged opposite with each other. That is, the first frame traces 201 at the B position in FIG. 1 is enlarged to obtain a pattern shown in FIG. 4. Similarly, the second frame trace 202 at the D position in FIG. 1 can be enlarged to obtain a pattern shown in FIG. 4.

Of course, the present invention does not limit the hollow portions 211 of the first frame trace 201 and the second frame trace 202 to have the same pattern. In other embodiments of the present invention, the patterns of the hollow portions 211 of the first frame trace 201 and the second frame trace 202 may be different. For example, the first frame trace 201 is the pattern shown in FIG. 3, and the second frame trace 202 is the pattern shown in FIG. 4.

Further, as shown in FIG. 1 and FIG. 2, in a preferred embodiment of the present invention, the transparent display region 10 is provided with a plurality of data lines 31 arranged in parallel and spaced apart, and a plurality of scan lines 32 arranged in parallel and spaced apart and intersect the plurality of data lines 31, wherein the plurality of data lines 31 are disposed in the second metal layer, and the plurality of scan lines 32 are disposed in the first metal layer.

Each data line 31 is electrically connected to one of the second frame traces 202.

Each scan line 32 is electrically connected to one of the first frame traces 201.

Furthermore, the transparent display region 10 further comprises a plurality of thin film transistors T and a plurality of pixel electrodes P arranged in an array. Each the thin film transistor T comprises a gate electrode 301, a source electrode 302, a drain electrode 303, and a semiconductor island 304. The gate electrode 301 is disposed in the first metal layer, and the source electrode 302 and the drain electrode 303 are disposed in the second metal layer. The semiconductor island 304 is disposed on the insulating layer 203 above the gate electrode 301. The source electrode 302 and the drain electrode 303 of each the thin film transistor T are respectively in contact with both ends of the semiconductor island 304 of the thin film transistor T. Each the scan line 32 is electrically connected to the gate electrodes 301 of a row of thin film transistors T, and each the data line 31 is electrically connected to the source electrodes 302 of a row of thin film transistors T. Each the pixel electrode P is electrically connected to the drain electrode 303 of the thin film transistor T.

It is worth mentioning that, as shown in FIG. 1, in some embodiments of the present invention, the plurality of scanning lines 32 are arranged at intervals in a vertical direction and extend in a horizontal direction in the transparent display region 10. The plurality of data lines 31 are arranged at intervals in the horizontal direction in the transparent display region 10 and extend in the vertical direction. The scan lines 32 of odd-numbered rows are electrically connected to the first frame trace 201 on a left side of the transparent display region 10, and the scan lines 32 of even-numbered rows are electrically connected to the first frame trace 201 on a right side of the transparent display region 10. Each the data line 31 is electrically connected to the second frame trace 202 disposed above the transparent display region 10. The first frame trace 201 on the left side of the transparent display region 10 is electrically connected to a first gate driver 101, and the first frame trace 201 on the right side of the transparent display region 10 is electrically connected to a second gate driver 102. Each second frame trace 202 is electrically connected to a source driver 200.

It should be noted that the above embodiments are only used as examples. In fact, the present invention has no special restrictions on the film layer where the frame trace 21 is disposed, and whether the frame trace 21 is connected to the transparent display region 10 or how. In the present invention, as long as the traces disposed in the frame region 20 can be regarded as the above-mentioned frame traces 21. That is to say, it is only necessary to dispose the traces without hollowed-out portions in the frame region 20 as the traces with the hollow portions 211 and the conductive portions 212 to implement the present invention, and obtain the frame region 20 with a transparent effect and the transparent display with an entire transparent, while preventing the frame traces 21 from disconnection.

Preferably, the transparent display is a non-self-emitting display such as a liquid crystal display or a self-emitting display such as an organic light emitting diode (OLED) display.

Further, the transparent display of the present invention is mainly applied to a display where an entire surface (including the frame region) needs to be transparent. Typical application scenarios such as an application on a windshield of a vehicle. Compared with a transparent display with a non-transparent frame region, the transparent display with the transparent frame region of the present invention can eliminate blind spot areas and avoid security risks caused by the blind spot areas when applied to the windshield of the vehicle, and improve vehicle safety.

Figure 5:
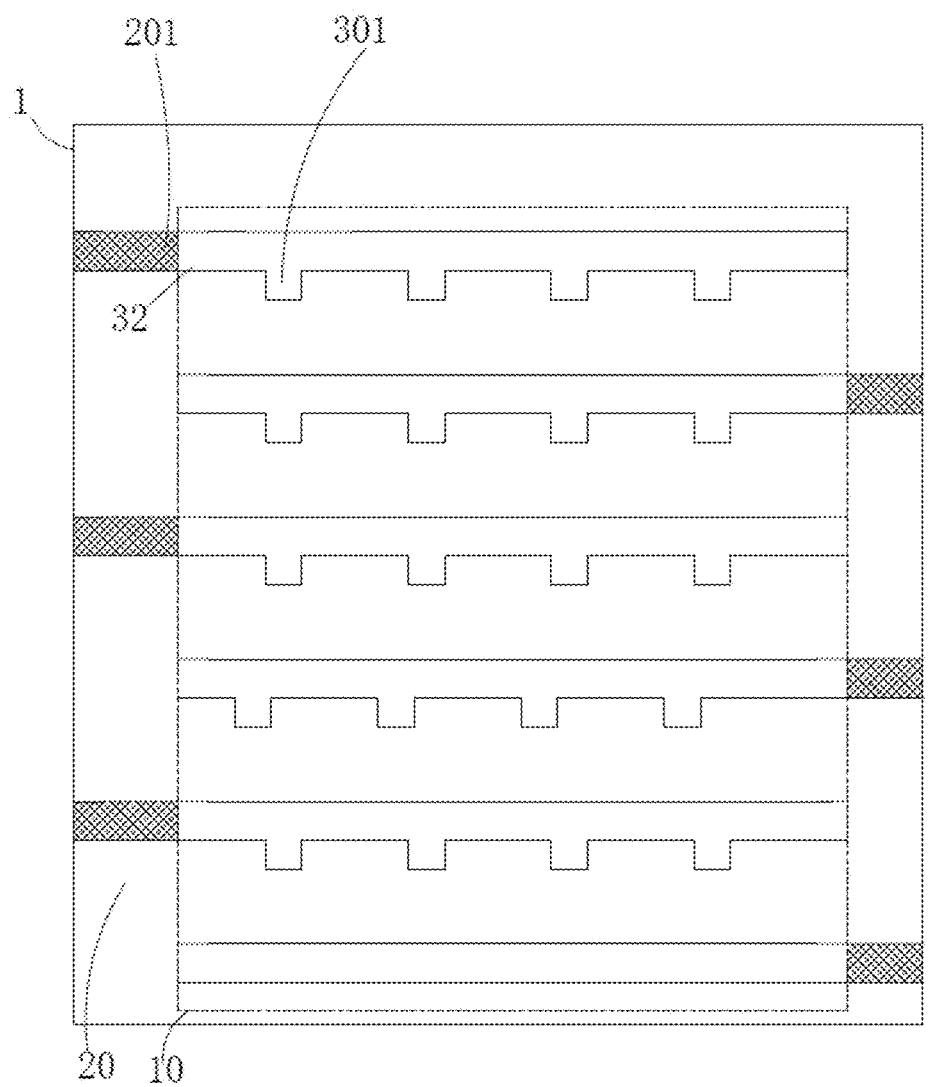
FIG. 5 is a schematic view of step S21 of a manufacturing method of the transparent display of the present invention.

Please refer to FIG. 5. The present invention further provides a manufacturing method of the transparent display, comprising following steps of:

S1: providing a substrate 1; wherein the substrate 1 comprises a transparent display region 10 and a frame region 20 surrounding the transparent display region 10.

Specifically, the substrate 1 is a glass substrate.

S2: forming a plurality of frame traces 21 in a frame region 20; wherein each frame trace 21 comprises a hollow portion 211 and a conductive portion 212 surrounding the hollow portion 211.

Specifically, in a preferred embodiment of the present invention, a ratio of an area of the hollow portion 211 to an area of the conductive portion 212 is greater than 1.5. Therefore, a transmittance of each frame trace 21 is greater than 60%, so as to ensure that each frame trace 21 has a high transmittance, so that the overall look and feel of the frame region 20 is transparent and invisible.

Specifically, a pattern shape of the hollow portion 211 can be disposed correspondingly as required. A typical example is shown in FIG. 3. In a first embodiment of the present invention, the hollow portion 211 comprise a plurality of triangular transparent sub-regions arranged in a mesh shape.

In addition, as shown in FIG. 4, in a second embodiment of the present invention, the hollow portion 211 may further comprises a plurality of diamond-shaped transparent sub-regions arranged in sequence, and two corners of two adjacent diamond-shaped transparent sub-regions are arranged opposite with each other.

Specifically, as shown in FIG. 1 and FIG. 2, the plurality of frame traces 21 in the present invention comprise a plurality of first frame traces 201 and a plurality of second frame traces 202. Wherein, the plurality of first frame traces 201 are disposed on a first metal layer, the plurality of second frame traces 202 are disposed on a second metal layer, and an insulating layer 203 is provided between the first metal layer and the second metal layer.

Correspondingly, in some embodiments of the present invention, both the hollow portions 211 of the first frame traces 201 and the second frame traces 202 have a plurality of triangular transparent sub-regions arranged in a mesh shape. That is, the first frame traces 201 at a B position in FIG. 1 is enlarged to obtain a pattern shown in FIG. 3. Similarly, the second frame trace 202 at a D position in FIG. 1 can be enlarged to obtain a pattern shown in FIG. 3.

Correspondingly, in some embodiments of the present invention, both the hollow portions 211 of the first frame trace 201 and the second frame trace 202 have a plurality of diamond-shaped transparent sub-regions arranged in sequence, and two corners of two adjacent diamond-shaped transparent sub-regions are arranged opposite with each other. That is, the first frame traces 201 at the B position in FIG. 1 is enlarged to obtain a pattern shown in FIG. 4. Similarly, the second frame trace 202 at the D position in FIG. 1 can be enlarged to obtain a pattern shown in FIG. 4.

Of course, the present invention does not limit the hollow portions 211 of the first frame trace 201 and the second frame trace 202 to have the same pattern. In other embodiments of the present invention, the patterns of the hollow portions 211 of the first frame trace 201 and the second frame trace 202 may be different. For example, the first frame trace 201 is the pattern shown in FIG. 3, and the second frame trace 202 is the pattern shown in FIG. 4.

Further, as shown in FIG. 1 and FIG. 2, in a preferred embodiment of the present invention, the transparent display region 10 is provided with a plurality of data lines 31 arranged in parallel and spaced apart, and a plurality of scan lines 32 arranged in parallel and spaced apart and intersect the plurality of data lines 31, wherein the plurality of data lines 31 are disposed in the second metal layer, and the plurality of scan lines 32 are disposed in the first metal layer.

Each data line 31 is electrically connected to one of the second frame traces 202.

Each scan line 32 is electrically connected to one of the first frame traces 201.

Correspondingly, the step S2 specifically comprises:

As shown in FIG. 5, S21: forming a first metal thin film on the substrate, and patterning the first metal thin film to obtain a first metal layer; wherein the first metal layer comprises a plurality of scan lines 32 and a plurality of first frame traces 201 arranged in parallel in the transparent display region, and each scan line 32 is electrically connected to one of the first frame traces 201.

S22: forming an insulating layer 203 on the substrate 1 and the first metal layer.

Figure 6:
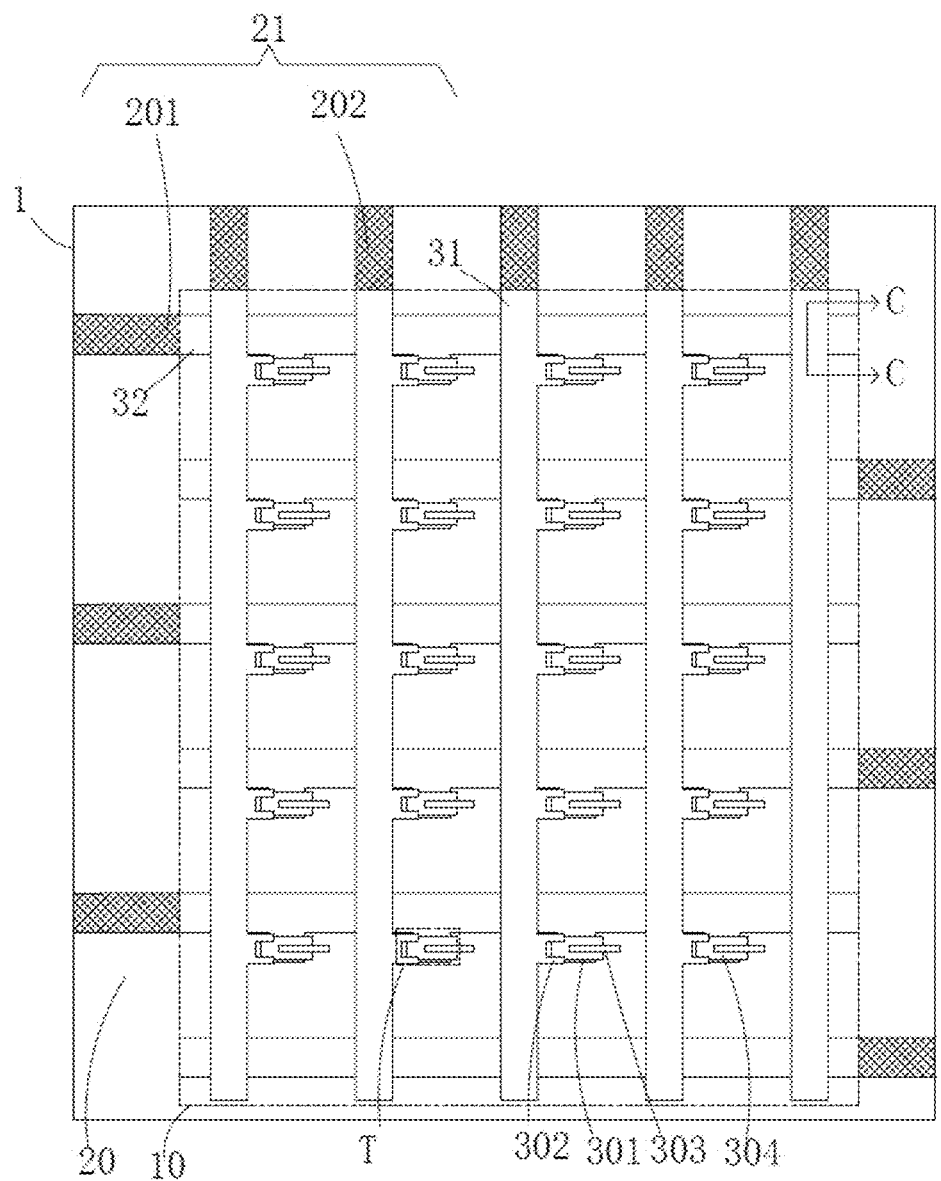
FIG. 6 is a schematic view of step S23 of the manufacturing method of the transparent display of the present invention.
Figure 7:
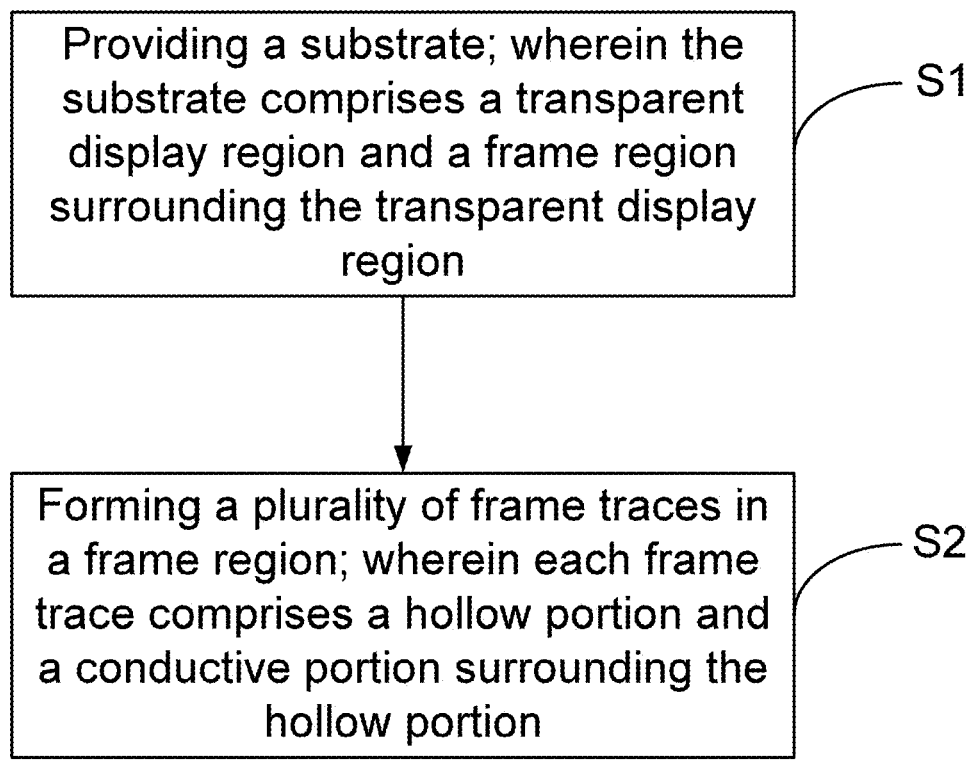
FIG. 7 is a flowchart of the manufacturing method of the transparent display according to the present invention.

As shown in FIG. 6. S23: forming a second metal thin film on the insulating layer 203, and patterning the second metal thin film to obtain a second metal layer; wherein the second metal layer comprises a plurality of data lines 31 and a plurality of second frame traces 202, the plurality of data lines 31 are arranged in parallel in the transparent display region and intersected the plurality of scan lines 32, and each data line 31 is electrically connected to one of the second frame traces 202.

Furthermore, the transparent display region 10 further comprises a plurality of thin film transistors T and a plurality of pixel electrodes P arranged in an array. Each the thin film transistor T comprises a gate electrode 301, a source electrode 302, a drain electrode 303, and a semiconductor island 304. The gate electrode 301 is disposed in the first metal layer, and the source electrode 302 and the drain electrode 303 are disposed in the second metal layer. The semiconductor island 304 is disposed on the insulating layer 203 above the gate electrode 301. The source electrode 302 and the drain electrode 303 of each the thin film transistor T are respectively in contact with both ends of the semiconductor island 304 of the thin film transistor T. Each the scan line 32 is electrically connected to the gate electrodes 301 of a row of thin film transistors T, and each the data line 31 is electrically connected to the source electrodes 302 of a row of thin film transistors T. Each the pixel electrode P is electrically connected to the drain electrode 303 of the thin film transistor T.

Correspondingly, the gate electrode 301 is also formed in the step S21, and the source electrode 302 and the drain electrode 303 are also formed in the step S23. The steps S22 and S23 further comprise a step of forming the semiconductor island 304.

Specific operations of the patterning process comprise: coating a photoresist, exposing, developing, etching, and removing a film.

It is worth mentioning that, as shown in FIG. 1, in some embodiments of the present invention, the plurality of scanning lines 32 are arranged at intervals in a vertical direction and extend in a horizontal direction in the transparent display region 10. The plurality of data lines 31 are arranged at intervals in the horizontal direction in the transparent display region 10 and extend in the vertical direction. The scan lines 32 of odd-numbered rows are electrically connected to the first frame trace 201 on a left side of the transparent display region 10, and the scan lines 32 of even-numbered rows are electrically connected to the first frame trace 201 on a right side of the transparent display region 10. Each the data line 31 is electrically connected to the second frame trace 202 disposed above the transparent display region 10. The first frame trace 201 on the left side of the transparent display region 10 is electrically connected to a first gate driver 101, and the first frame trace 201 on the right side of the transparent display region 10 is electrically connected to a second gate driver 102. Each second frame trace 202 is electrically connected to a source driver 200.

It should be noted that the above embodiments are only used as examples. In fact, the present invention has no special restrictions on the film layer where the frame trace 21 is disposed, and whether the frame trace 21 is connected to the transparent display region 10 or how. In the present invention, as long as the traces disposed in the frame region 20 can be regarded as the above-mentioned frame traces 21. That is to say, it is only necessary to dispose all the traces in the frame region 20 as the traces with the hollow portions 211 and the conductive portions 212 to implement the present invention, and obtain the frame region 20 with a transparent effect and the transparent display with an entire transparent, while preventing the frame traces 21 from disconnection.

Preferably, the transparent display is a non-self-emitting display such as a liquid crystal display or a self-emitting display such as an organic light emitting diode (OLED) display.

Further, the transparent display of the present invention is mainly applied to a display where an entire surface (including the frame region) needs to be transparent. Typical application scenarios such as an application on a windshield of a vehicle. Compared with a transparent display with a non-transparent frame region, the transparent display with the transparent frame region of the present invention can eliminate blind spot areas and avoid security risks caused by the blind spot areas when applied to the windshield of the vehicle, and improve vehicle safety.

As mentioned above, the present invention provides a transparent display comprising a substrate and a plurality of frame traces. The substrate comprises a transparent display region and a frame region surrounding the transparent display region. The plurality of frame traces are disposed in the frame region, and each frame trace comprises a hollow portion and a conductive portion surrounding the hollow portion. By disposing the hollow portion in each the frame trace to improve a transmittance of each the frame trace, thereby improving a transparency of the frame region, reducing a risk of disconnection, and improving a product yield. The present invention further provides a manufacturing method of the transparent display, which can improve a transparency of a frame region, reduce a risk of disconnection, and improve a product yield.

In the above, various other corresponding changes and modifications can be made according to the technical solutions and technical ideas of the present invention to those skilled in the art, and all such changes and modifications are within the scope of the claims of the present invention.

What is claimed is:

1. A transparent display, wherein the transparent display is an organic light emitting diode (OLED) display and comprises:
   a substrate and a plurality of frame traces;
   wherein the substrate comprises a transparent display region and a frame region defined on a left side, a right side, and an upper side of the transparent display region, and the transparent display region and the frame region are transparent;
   wherein the plurality of frame traces are disposed in the frame region, and each frame trace comprises a hollow portion and a conductive portion surrounding the hollow portion, and a ratio of an area of the hollow portion to an area of the conductive portion is greater than 1.5 in each frame trace;

wherein the plurality of frame traces comprise a plurality of first frame traces disposed in a first metal layer and a plurality of second frame traces disposed in a second metal layer, and an insulating layer is provided between the first metal layer and the second metal layer;

wherein the transparent display region is provided with a plurality of data lines arranged at intervals and a plurality of scan lines arranged at intervals and intersecting the plurality of data lines, the plurality of data lines are disposed in the second metal layer, and the plurality of scan lines are disposed in the first metal layer;

wherein each scan line in odd rows of the plurality of scan lines is electrically connected to a respective one of the plurality of first frame traces on the left side of the transparent display region, each scan line in even rows of the plurality of scan lines is electrically connected to a respective one of the plurality of first frame traces on the right side of the transparent display region, and each data line is electrically connected to a respective one of the plurality of second frame traces on the upper side of the transparent display region; and wherein the first frame traces on the left side of the transparent display region are electrically connected to a first gate driver, and the first frame traces on the right side of the transparent display region are electrically connected to a second gate driver, and the plurality of second frame traces are electrically connected to a source driver.

2. The transparent display as claimed in claim 1, wherein the hollow portion comprises a plurality of triangular transparent sub-regions arranged in a mesh shape.

3. The transparent display as claimed in claim 1, wherein the hollow portion comprises a plurality of diamond-shaped transparent sub-regions arranged in sequence, and two corners of two adjacent diamond-shaped transparent sub-regions are arranged opposite with each other.

4. A manufacturing method of a transparent display, comprising following steps of:

S1: providing a substrate; wherein the substrate comprises a transparent display region and a frame region defined on a left side, a right side, and an upper side of the transparent display region, wherein the transparent display region and the frame region are transparent; and S2: forming a plurality of frame traces in the frame region; wherein each frame trace comprises a hollow portion and a conductive portion surrounding the hollow portion, and a ratio of an area of the hollow portion to an area of the conductive portion is greater than 1.5 in each frame trace;

wherein the transparent display is an organic light emitting diode (OLED) display;

wherein the plurality of frame traces comprise a plurality of first frame traces disposed in a first metal layer and a plurality of second frame traces disposed in a second metal layer, and an insulating layer is provided between the first metal layer and the second metal layer;

wherein the transparent display region is provided with a plurality of data lines arranged at intervals and a plurality of scan lines arranged at intervals and intersecting the plurality of data lines, the plurality of data lines are disposed in the second metal layer, and the plurality of scan lines are disposed in the first metal layer;

wherein each scan line in odd rows of the plurality of scan lines is electrically connected to a respective one of the plurality of first frame traces on the left side of the transparent display region, each scan line in even rows of the plurality of scan lines is electrically connected to a respective one of the plurality of first frame traces on the right side of the transparent display region, and each data line is electrically connected to a respective one of the plurality of second frame traces on the upper side of the transparent display region; and wherein the first frame traces on the left side of the transparent display region are electrically connected to a first gate driver, and the first frame traces on the right side of the transparent display region are electrically connected to a second gate driver, and the plurality of second frame traces are electrically connected to a source driver.

5. The manufacturing method of the transparent display as claimed in claim 4, wherein the hollow portion comprises a plurality of triangular transparent sub-regions arranged in a mesh shape.

6. The manufacturing method of the transparent display as claimed in claim 4, wherein the hollow portion comprises a plurality of diamond-shaped transparent sub-regions arranged in sequence, and two corners of two adjacent diamond-shaped transparent sub-regions are arranged opposite with each other.

7. The manufacturing method of the transparent display as claimed in claim 4, wherein S2 further comprises the steps of:

S21: forming a first metal thin film on the substrate, and patterning the first metal thin film to obtain the first metal layer;

S22: forming the insulating layer on the substrate and the first metal layer; and S23: forming a second metal thin film on the insulating layer, and patterning the second metal thin film to obtain the second metal layer.

* * * * *